Nov. 22, 1966 J. McGLASSON, JR., ETAL 3,286,690
VAPOR DEPOSITION MASK
Filed May 9, 1963
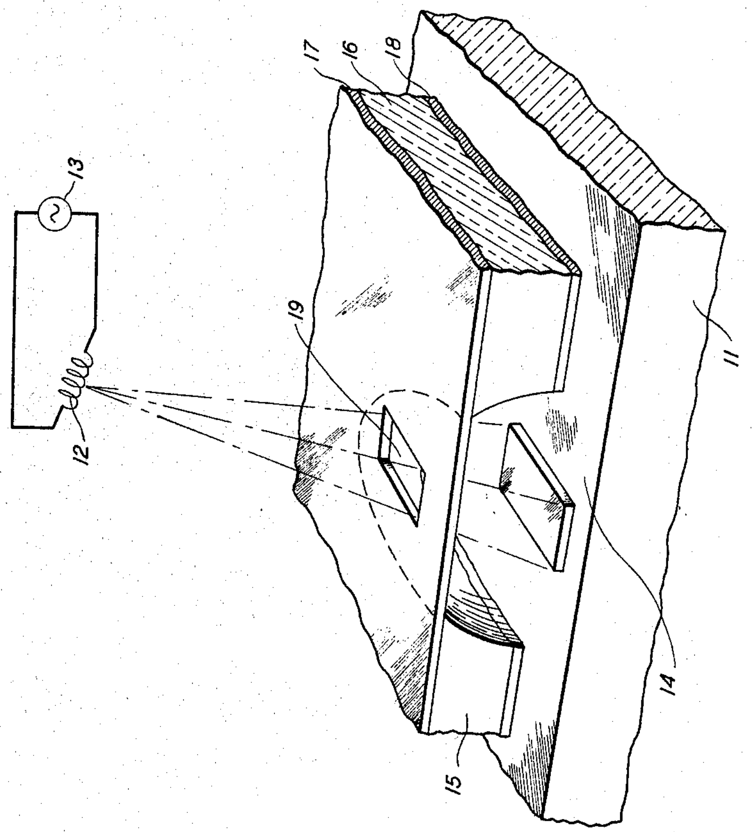
INVENTORS J. Mc GLASSON, JR.
J. T. NELSON
BY H. W. Lockhart
ATTORNEY

United States Patent Office 3,286,690
Patented Nov. 22, 1966

3,286,690
VAPOR DEPOSITION MASK

John McGlasson, Jr., Middlesex, and James T. Nelson, Gillette, N.J., assignors to Bell Telephone Laboratories, Incorporated, New York, N.Y., a corporation of New York Filed May 9, 1963, Ser. No. 279,192
3 Claims. (Cl. 118—504)

This invention relates to the fabrication of semiconductor devices and more particularly to the fabrication of metal electrodes on diffused junction semiconductor devices. The invention relates also to the making of patterns of insulating material on semiconductors.

Many semiconductor devices, for example, transistors of the diffused base configuration of the type described in United States Patent 3,028,655, have contact electrodes produced by depositing metal films on limited portions of the device. Deposited metal film patterns are also utilized on a variety of other semiconductor devices including diodes and certain integrated circuit structures. It is the current practice generally to fabricate these deposited metal electrodes by vapor deposition through masks containing apertures corresponding to the desired electrode pattern. Such masks are fabricated by photoetching or electroforming the desired patterns in very thin metal sheets.

Metal evaporation masks, although satisfactory for many applications, present limitations for the precise and minute dimensions required by the electrode patterns of high frequency devices. In particular, the metal masks are self-supporting and therefore are of appreciable thickness which, however, reduces the resolving power of the mask when the apertures have dimensions of the order of less than one-half mil. If the metal mask is of appreciable thickness, the edges of the apertures themselves present a scattering surface. In addition to the mechanical problems associated with producing thin metal sheets, a reduction in thickness renders the mask more susceptible to buckling which likewise affects the resolving power of the mask. A further problem in the use of metal evaporation masks arises from the differential thermal expansion exhibited by the semiconductor workpiece and the metal mask fixture.

Accordingly, an object of this invention is better patterns of deposited materials, both metal and insulating, for semiconductor devices.

In particular, an object is an improved evaporation mask for use in fabricating semiconductor devices.

In accordance with this invention, an evaporation mask is made in a thin film of a semiconductor oxide which is supported on a thin slice of semiconductor material. For facility in fabrication as well as mechanical protection, the deposition mask in accordance with this invention comprises a thin slice of low grade or waste semiconductor material which may have a thickness of from about three to about ten mils. An oxide film, for example, of silicon is produced on both faces of the semiconductor slice to a thickness of several thousand Angstroms. Using photolithographic techniques, the desired mask pattern is produced in the oxide film on one face of the slice. In the oxide film on the opposite face of the slice an array of enlarged apertures are likewise produced by a photolithographic technique, which apertures are in register with the smaller mask apertures in the opposite side. These enlarged holes are, in effect, clearance openings. The semiconductor material underlying the clearance holes is then etched away to produce an undercut passage from the mask apertures on one oxide coating to the clearance openings in the other oxide coating. The slice then is placed on the surface on which the metal film electrodes are to be deposited and the vapor deposition is carried out in accordance with well-known procedures.

Thus the mask in accordance with this invention is of material which is thermally compatible with the material being worked upon. Moreover, and most important, the actual mask is produced in the oxide layer on one surface of the slice and because of its thinness, namely, several thousand Angstroms, provides a high degree of definition. Moreover, with these advantages the mask retains its flatness through a considerable temperature range. The above-described mask also inherently may provide the necessary spacing from the work surface. This spacing is supplied by the thickness of the semiconductor slice used to support the mask. Or, if less spacing is required, a spacer, for example, of less than a mil may be used, with the mask reversed to put the oxide mask layer closer to the work surface.

The invention and its other objects and features will be better understood from the following detailed description taken in connection with the drawing which shows in schematic perspective view, partially in section, the use of the mask in accordance with this invention for vapor depositing a metal film electrode.

Referring to the drawing, the substrate 11 of semiconductor material represents the surface portion of the emitter-base zones of a diffused base germanium transistor. The vapor deposition source is represented schematically by the wire filament 12 coupled to a power source 13. As is known, the entire apparatus is enclosed in an hermetic enclosure to enable processing in a substantial vacuum. This enclosure has been omitted from the drawing for simplicity.

Interposed between the filament 12 and the deposition surface 14, and resting on the work surface, is a portion 15 of the mask in accordance with this invention. The mask comprises a slice 16 of silicon having a thickness of about three mils. Typically, this silicon may be polycrystalline material or may be single crystal of a resistivity range or resistivity distribution such as to render it otherwise unusable. Oxide layers 17 and 18 are provided on both surfaces of the silicon slice 16 by conventional techniques. One well-known method for producing such oxide layers is by thermal oxidation in accordance with the methods disclosed in United States Patent 2,930,722. Alternatively, the oxide layers may be produced by vapor deposition using silicon oxide sources. The oxide films 17 and 18 have a thickness of approximately 6,000 Angstroms. Alternatively, oxide films may be produced by well-known techniques such as pyrolytic decomposition of silanes, and by reactive sputtering. These latter techniques are particularly advantageous for depositing films on other semiconductors such as germanium or III–V compounds, such as gallium arsenide, gallium phosphide, indium arsenide, and indium phosphide.

The mask pattern, of which only a single aperture 19 is shown, is produced in the oxide layer 17 on the upper face of the slice by well-known photolithographic techniques. That is, an emulsion film is applied to the oxide layer surface and then is exposed photographically and developed to produce the desired pattern in the emulsion film. The pattern then is etched through the oxide film in accordance with the procedure disclosed, for example, in the application of J. Andrus, Serial No. 678,411, filed August 15, 1957, and now abandoned. The mask then is turned over and a pattern of enlarged holes, of which only one is shown, is developed similarly in the other oxide layer 18. These clearance holes are in registration with the apertures in the mask side and are of considerably larger size and different configuration. Finally, a selective etchant is applied to the surface containing the enlarged or clearance holes. This etchant attacks the underlying silicon and results in a passageway connecting the mask aperture 19 in the layer 17 and the clearance hole in the layer 18.

With the completed mask in position on the semiconductor surface, as shown in the drawing, the deposition is carried out in accordance with well-known vacuum deposition procedures. The deposited metal film pattern is sharply defined by the aperture in the upper oxide layer and its dimensions are a function of the distances separating the source, the mask, and the work surface. This arrangement is suitable also for accomplishing the well-known criss-cross evaporation technique in which two sources are used, successively, to produce a pair of precisely spaced-apart deposited metal electrodes. Moreover, in addition to metal deposition, the mask may be used for depositing patterns of other materials such as insulating oxides. The mask in accordance with this invention, in general, may be used with any deposition process.

The facility and advantages of the foregoing described mask arise chiefly from the fact that the mask pattern is produced in an extremely thin layer of material, namely, the oxide layer which may have a thickness of the order of thousands of Angstroms. A particular range is from 3000 to 10,000 Angstroms. The oxide layer, in turn, is supported by a material which can be provided in the form of a relatively thin slice of sufficient strength and mechanical properties so as to retain its flatness. Slices of from 3 to 20 mils thickness may be used. Accordingly, other semiconductor materials than silicon may be employed for supporting such masks, it being necessary only that it be possible to produce an oxide layer on the surface. For example, the slice may be of germanium upon which silicon oxide is deposited by evaporation. It is, of course, desirable from the standpoint of fabrication that the oxide layer and the semicoductor material be susceptible to standard photolithographic processing for ease in producing the patterns and the clearance holes.

It is, of course, obvious that these masks made from semiconductor material and the oxides thereof are much less subject to differential thermal expansion effects than in the case of metal masks. Accordingly, changes in processing temperature during deposition and alloying steps are less likely to cause unwanted dimensional changes in the deposited pattern. From this standpoint, it is desirable that the mask material be the same as the material being deposited on, or that the two have the desired relationship of thermal expansion coefficients. For example, a germanium mask is suitable, for most purposes, on gallium arsenide substrates.

Although the invention has been described in terms of certain specific embodiments, it will be understood that various adaptations may be made by those skilled in the art which will likewise be within the spirit and scope of the invention.

What is claimed is:

1. A mask for controlling the deposition pattern of vapor deposited material from an evaporation source comprising a thin slice of semiconductor material having a coating of oxide on at least one face thereof, said coating having an aperture therein defining the deposition pattern, said slice having an undercut clearance passage therethrough underlying said aperture, any plane cross sectional area of said passage parallel to the plane of said one face being greater than the area of said aperture and none of said slice lying within the perimeter of said aperture defined by lines perpendicular to the face around the perimeter of said aperture.

2. A mask in accordance with claim 1 in which said coating is a seminconductor oxide.

3. A mask in accordance with claim 1 in which said coating is silicon oxide.

References Cited by the Examiner

UNITED STATES PATENTS

| | | | |
|---|---|---|---|
| 2,899,344 | 8/1959 | Atalla et al. | 148—33.2 X |
| 3,193,418 | 7/1965 | Cooper et al. | 148—187 |

CHARLES A. WILLMUTH, *Primary Examiner.*

J. P. McINTOSH, *Assistant Examiner.*